(12) United States Patent
Tung et al.

(10) Patent No.: US 12,272,594 B2
(45) Date of Patent: Apr. 8, 2025

(54) SEMICONDUCTOR DEVICE AND METHOD OF FABRICATING THE SAME HAVING A SECOND ACTIVE REGION DISPOSED AT AN OUTER SIDE OF A FIRST ACTIVE REGION

(71) Applicant: Fujian Jinhua Integrated Circuit Co., Ltd., Quanzhou (CN)

(72) Inventors: Yu-Cheng Tung, Kaohsiung (TW); Janbo Zhang, Zhangzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 173 days.

(21) Appl. No.: 17/396,774

(22) Filed: Aug. 9, 2021

(65) Prior Publication Data
US 2022/0375783 A1   Nov. 24, 2022

(30) Foreign Application Priority Data

May 20, 2021 (CN) .......................... 202110553318.2
May 20, 2021 (CN) .......................... 202121091826.5

(51) Int. Cl.
*H01L 21/762* (2006.01)
*H01L 21/8234* (2006.01)

(52) U.S. Cl.
CPC .............. *H01L 21/76229* (2013.01); *H01L 21/823481* (2013.01)

(58) Field of Classification Search
CPC ............... H01L 21/762; H01L 27/0207; H01L 21/76229
See application file for complete search history.

(56) References Cited

U.S. PATENT DOCUMENTS

| 9,704,816 B1 | 7/2017 | Huang |
| 2007/0049010 A1* | 3/2007 | Burgess ............... H10B 12/488 257/E21.507 |

(Continued)

FOREIGN PATENT DOCUMENTS

| CN | 109991806 A | * 7/2019 | ............... G03F 1/76 |
| CN | 112133699 A | 12/2020 | |
| KR | 20120004802 A | * 1/2012 | |

OTHER PUBLICATIONS

Zhang, the specification, including the claims, and drawings in the U.S. Appl. No. 17/336,275, filed Jun. 1, 2021.

(Continued)

*Primary Examiner* — Peter Bradford
(74) *Attorney, Agent, or Firm* — Winston Hsu (57) ABSTRACT

The present disclosure relates to a semiconductor device and a method of fabricating the same, the semiconductor device including a substrate, an active structure and a shallow trench isolation. The active structure is disposed within the substrate, including a plurality of first active fragments and a plurality of second active fragments. The first active fragments and the second active fragments are parallel and separately extended along a first direction, and the second active fragments are disposed outside all of the first active fragments. The first active fragments have a same length in the first direction, being a first length, the second active fragment have a second length in the first direction, and the second length is greater than the first length.

15 Claims, 7 Drawing Sheets

(56) References Cited

U.S. PATENT DOCUMENTS

| | | | | |
|---|---|---|---|---|
| 2015/0091127 | A1* | 4/2015 | Lee | H10B 12/09 |
| | | | | 257/506 |
| 2016/0233297 | A1* | 8/2016 | Tomoyama | H01L 21/762 |
| 2017/0025420 | A1* | 1/2017 | Park | H10B 12/09 |
| 2019/0139767 | A1* | 5/2019 | Shih | H01L 21/0338 |
| 2021/0118886 | A1* | 4/2021 | Choi | G11C 5/063 |
| 2021/0375869 | A1* | 12/2021 | Zhang | H01L 21/3086 |

OTHER PUBLICATIONS

The specification, including the claims, and drawings in the CN application No. 202010969107.2 , Filing Date: Sep. 15, 2020.
The specification, including the claims, and drawings in the CN application No. 202022661807.3 , Filing Date: Nov. 17, 2020.
Zhang, the specification, including the claims, and drawings in the U.S. Appl. No. 17/396,775, filed Aug. 9, 2021.

\* cited by examiner

SEMICONDUCTOR DEVICE AND METHOD OF FABRICATING THE SAME HAVING A SECOND ACTIVE REGION DISPOSED AT AN OUTER SIDE OF A FIRST ACTIVE REGION

BACKGROUND OF THE INVENTION

1. Field of the Invention

The present disclosure generally relates to a semiconductor device and a method of fabricating the same, and more particularly, to a semiconductor device having active regions and shallow trench isolations and a method of fabricating the same.

2. Description of the Prior Art

With the miniaturization of semiconductor devices and the complexity of integrated circuits, the size of elements is continuously shrinking and the structure is constantly changing. Therefore, maintaining the performance of small-sized semiconductor elements is the standard purpose of the present industry. In the semiconductor fabricating process, most of the active areas (AAs) are defined on the substrate as a bass element, and then, the required elements are further formed on the AAs. Generally, the AAs are plural patterns formed within the substrate through the photolithography and etching processes. However, due to the sized-shrinking requirements, the width of the AAs has been gradually reduced, and the pitch between the AAs has also been gradually reduced thereby, so that, the fabricating process of AAs encounters plenty limitations and challenges that fails to meet the practical product requirements.

SUMMARY OF THE INVENTION

One of the objectives of the present disclosure provides a semiconductor device and a fabricating method thereof, in which active fragments with a relative greater length are disposed outside the periphery of active fragments with a relative smaller length, and directly contact a peripheral active region. Accordingly, the active fragments may effectively improve the stresses around the semiconductor device, thereby avoiding the semiconductor structural collapse or damages. Then, the semiconductor device of the present disclosure may therefore obtain better functions and device performance.

To achieve the purpose described above, one embodiment of the present disclosure provides a semiconductor device including a substrate, an active structure and a shallow trench isolation. The active structure is disposed in the substrate and includes a plurality of first active fragments and a plurality of second active fragments. The first active fragments and the second active fragments are parallel and separately extended along a first direction, and the second active fragments are disposed outside a periphery of all of the first active fragments, wherein the first active fragments have a same length in the first direction, being a first length, the second active fragments have a second length in the first direction, and the second length is greater than the first length. The shallow trench isolation is disposed within the substrate to surround the active structure.

To achieve the purpose described above, one embodiment of the present disclosure provides a method of fabricating a semiconductor device including the following steps. Firstly, a substrate is provided, and an active structure is formed in the substrate, wherein the active structure includes a plurality of first active fragments and a plurality of second active fragments. The first active fragments and the second active fragments are parallel and separately extended along a first direction, and the second active fragments are disposed outside a periphery of all of the first active fragments, wherein the first active fragments have a same length in the first direction, being a first length, the second active fragments have a second length in the first direction, and the second length is greater than the first length. The shallow trench isolation is disposed within the substrate to surround the active structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 2 are schematic diagrams illustrating a semiconductor device according to a first preferable embodiment in the present disclosure, wherein:

FIG. 3 to FIG. 5 are schematic diagrams illustrating a fabricating method of a semiconductor device according to a preferable embodiment in the present disclosure, wherein:

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
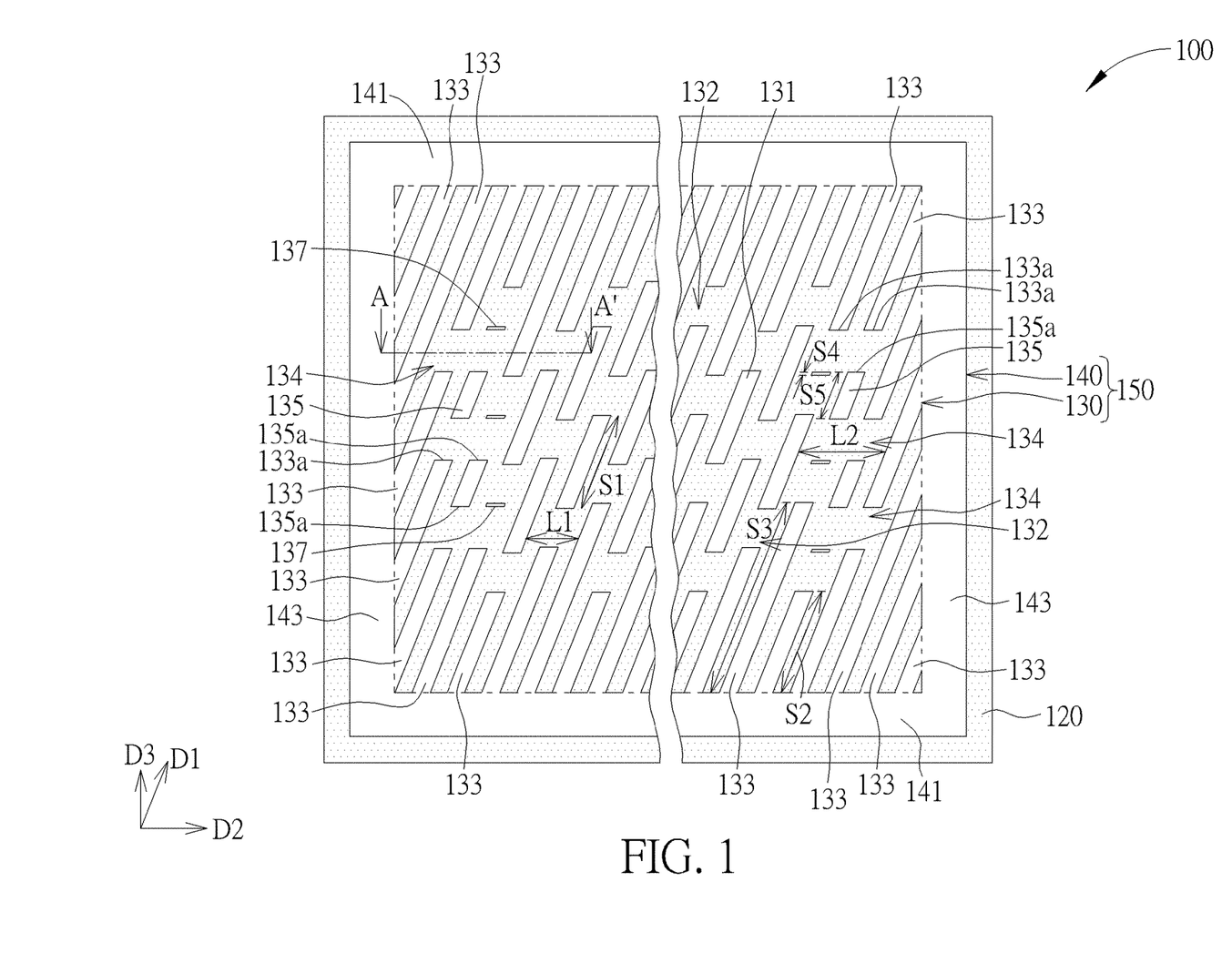
FIG. 1 shows a top view of an active structure of a semiconductor device.
Figure 2:
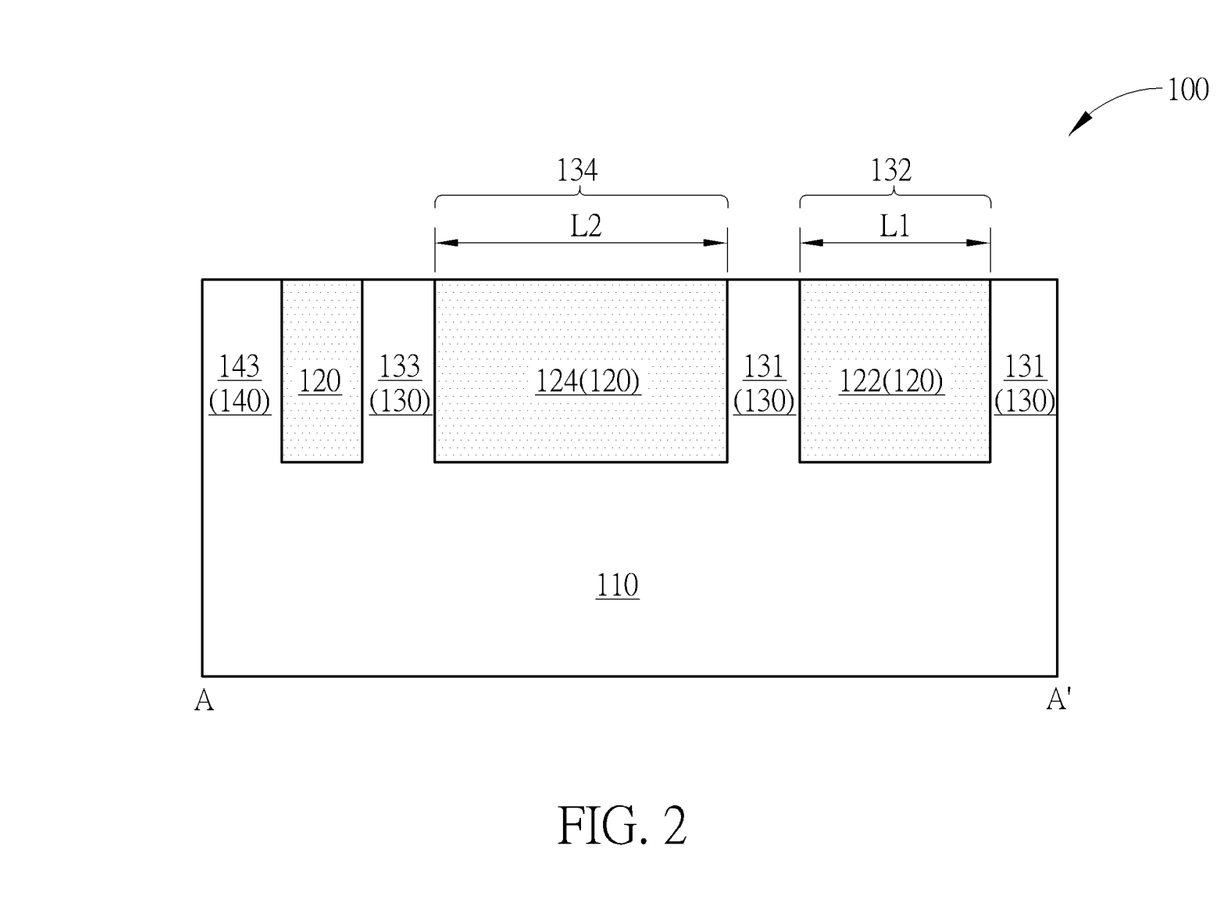
FIG. 2 shows a cross-sectional view of a semiconductor device taken along a cross-line A-A' in FIG. 1.

Please refer to FIGS. 1-2, which illustrate schematic diagrams of a semiconductor device 100 according to the first preferable embodiment in the present disclosure, with FIG. 1 illustrating a top view of the semiconductor device 100, and with FIG. 2 illustrating a cross-sectional view of the semiconductor device 100. The semiconductor device 100 includes a substrate 110, for example a silicon substrate, a silicon containing substrate (such as SiC or SiGe), or a silicon-on-insulator (SOI) substrate, and at least one shallow trench isolation (STI) 120 is disposed in the substrate 110, to define an active structure 150 in the substrate 110. That is, the shallow trench isolation 120 is disposed around the active structure 150. The active structure 150 further includes a first active region 130 and a second active region 140, and the second active region 140 disposed outside the periphery of the first active region 130, to serve as a peripheral active region. In one embodiment, the first active region 130 is for example disposed at an area being highly integrity in the semiconductor device 100, such as an active area (AA) region or a memory cell region, and the second active region 140 is for example disposed at an area being lower integrity in the semiconductor device 100, such as a peripheral region, but is not limited thereto.

As shown in FIG. 1 and FIG. 2, the first active region 130 detailed includes a plurality of first active fragments 131, a plurality of second active fragments 133 and a plurality of third active fragments 135, being parallel extended along a same direction (such as a first direction D1). The first direction D1 is for example not perpendicular to the x-direction (such as a second direction D2) or the y-direction (such as a third direction D3). Precisely speaking, the first active fragments 131, the second active fragments 133, and the third active fragments 135 are separately disposed within the substrate 110, and the second active fragments 133 are disposed outside the periphery of all of the third active fragments 135 and all of the first active fragments 131. As shown in FIG. 1, the first active fragments 131, the second active fragments 133 and the third active fragments 135 are sequentially arranged along the first direction D1 into plural columns, thereby presenting a particular arrangement, such as an array arrangement, but not limited thereto.

It is noted that two adjacent ones of the first active fragments 131 are separately disposed from each other by a first opening 132, and each of the first active fragments 131 has a same length S1 in the first direction D1. Also, the adjacent ones of the first active fragments 131 and the second active fragments 133 are also separately disposed from each other by a first opening 132, and each of the second fragments 133 has a various length in the first direction D1, such as lengths S2, S3 and the like, which are both greater than the length S1 of the first active fragments 131. The third active fragments 135 are disposed between the second active fragments 133 and the first active fragments 135 in the second direction D2, and two adjacent ones of the third active fragments 135, or the adjacent ones of the second active fragments 133 and the third active fragments 135 are separately disposed from each other by a second opening 134 in the third direction D3. Accordingly, two adjacent ones of the third active fragments 135 in the second direction D2 may have aligned end faces 135a, two adjacent ones of the second active fragments 133 in the second direction D2 may have aligned end faces 133a, and the adjacent ones of the second active fragments 133 and the third active fragments 135 may have aligned end faces 133a, 135a, as shown in FIG. 1. It is noted that, a portion of the third active fragments 135 have two opposite end faces 135a in the third direction D3, in which one of the two opposite end faces 135a is in alignment with the end face 133a of the second active fragment 133 adjacent thereto, and another one of the two opposite end faces 135a is in alignment with the end face 135a of the third active fragment 135 adjacent thereto. In addition, two adjacent ones of the third active fragments 137, 135 in the second direction D2 may have different lengths in the first direction D1, such as lengths S4, S5, which are all smaller than the length S1 of the first active fragments 131.

On the other hands the second openings 134 are disposed at two opposite sides of all of the first openings 132 in the second direction D2, and the second openings 134 and the first openings 132 are sequentially arranged along the third direction D3 into plural columns, with the second openings 134 or the first openings 132 arranged within each column being in alignment with each other, with the second openings 134 or the first openings 132 arranged within two adjacent columns being in misalignment with each other in the second direction D2, thereby presenting an array arrangement as a whole, but not limited thereto. The second openings 134 have a relative greater maximum diameter L2 in the second direction D2, being greater than the maximum diameter L1 of the first openings 132 in the second direction D2. Then, the portion of the shallow trench isolation 120 filled in the first openings 132, second openings 134 may therefore form a plurality of first isolation portions 122 and a plurality of second isolation portion 124, respectively. The first isolation portions 122 and the second isolation portions 124 may therefore obtain the corresponding widths L1, L2, respectively, as shown in FIG. 2. The first isolation portions 122 are disposed either between two adjacent ones of the first active fragments 131, or between adjacent ones of the first active fragments 131 and the second active fragments 133, and the second isolation portions 124 are disposed either between two adjacent ones of the second active fragments 133, or between adjacent ones of the second active fragments 133 and the third active fragments 135, for further isolating each of the first active fragments 131, the second active fragments 133 and the third active fragments 135.

The second active region 140 detailed includes at least one first edge 141 extended along the second direction D2, and at least one second edge 143 extended along the third direction D3, such that, the whole second active region 140 may perform like a rectangular frame to directly in contact with the second active fragments 133. That is, all of the second active fragments 133 may further connect to the first edge 141, the second edge 143, or simultaneously connect to the first edge 141 and the second edge 143 of the second active region 140 directly. On the other hands, the first active fragments 131, and the third active fragments 135 are completely isolated from the second active region 140 through the first isolation portions 122 and the second isolation portions 124, instead of being connected with thereto, as shown in FIG. 1. With these arrangements, the second active region 140 is allowable to uniformly disperse the stresses suffered from the first active region 130 and the shallow trench isolation 120, thereby obtaining a further reliable structure. People in the art should fully realize that the practical disposing number of the first edge or the second edge may be further adjustable due to practical product requirements, or the second active region is not limited to present the rectangular frame, for example, further edges may be additionally disposed to make the second active region to perform like various shapes.

Through these arrangements, the semiconductor device 100 of the first preferable embodiment of the present disclosure is provided, in which the second active fragments 133 with the relative longer length (for example lengths S2, S3) are disposed outside the periphery of the first active fragments 131 and the third active fragments 137, 135 with the relative shorter length (for example the length S1, and the lengths S4, S5 respectively), and directly contacts the at least one edge (including the first edge 141, the second edge 143, or the first edge 141 and the second edge 143) of the second active region 140. In this way, the second active fragments 133 enable to provide different extension lengths to stabilize and to strengthen the structure of the peripheral active region, namely the second active region 140, disposed around the first active fragments 131, thereby improving the peripheral stresses of the semiconductor device 100, and avoiding the collapse or cracking of the surrounding structure. Furthermore, the second active fragments 133 include the relative greater lengths such as the lengths S2, S3, and which may uniformly disperse the stresses suffered from the shallow trench isolation 120 in further, so as to obtain a reliable structure. After that, the semiconductor device 100 may be further used on fabricating other semiconductor active devices, such as a transistor device or a memory device, to significantly improve the performance of the subsequently formed devices.

Figure 3:
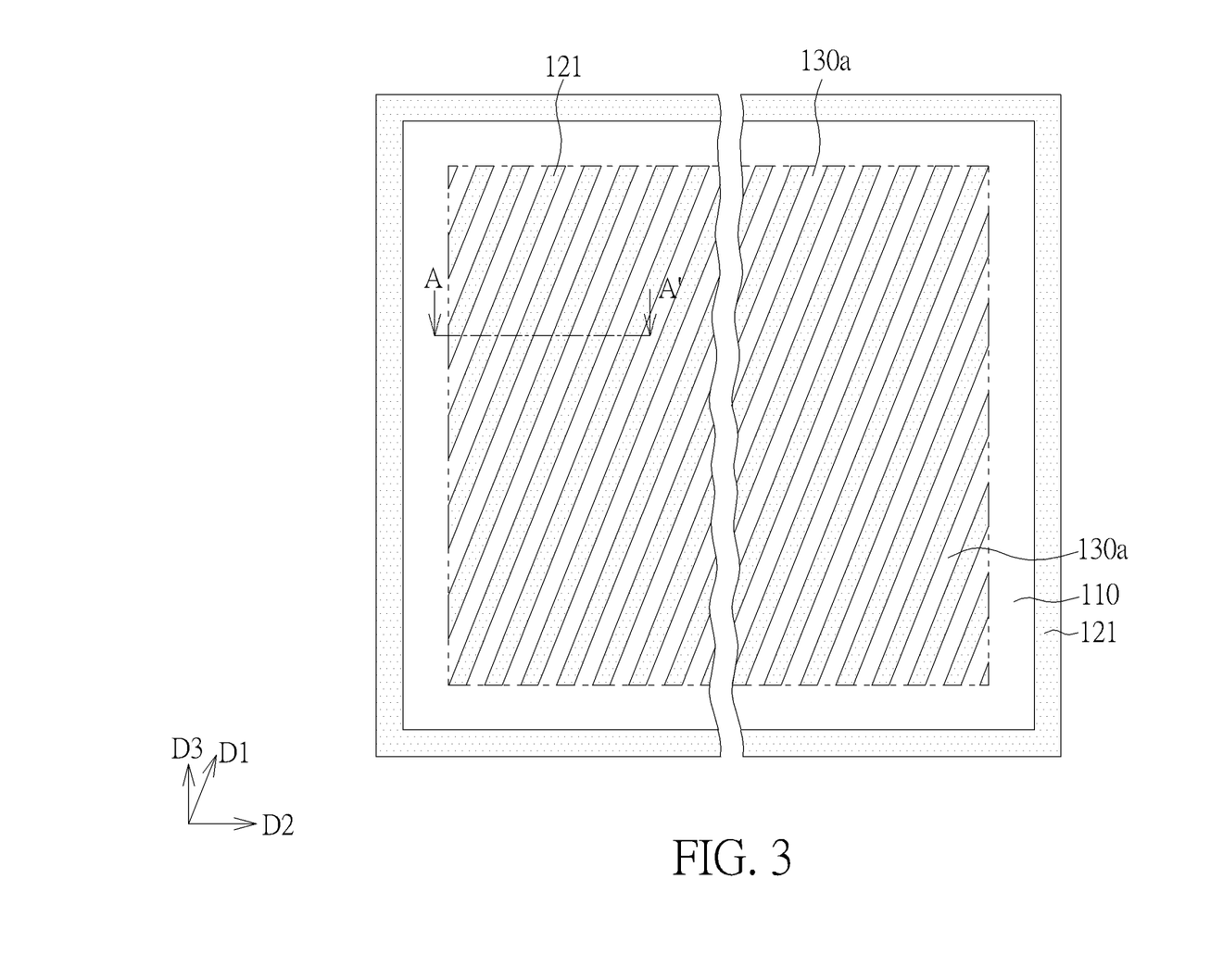
FIG. 3 shows a top view illustrating a semiconductor structure after forming a shallow trench and active region units.
Figure 4:
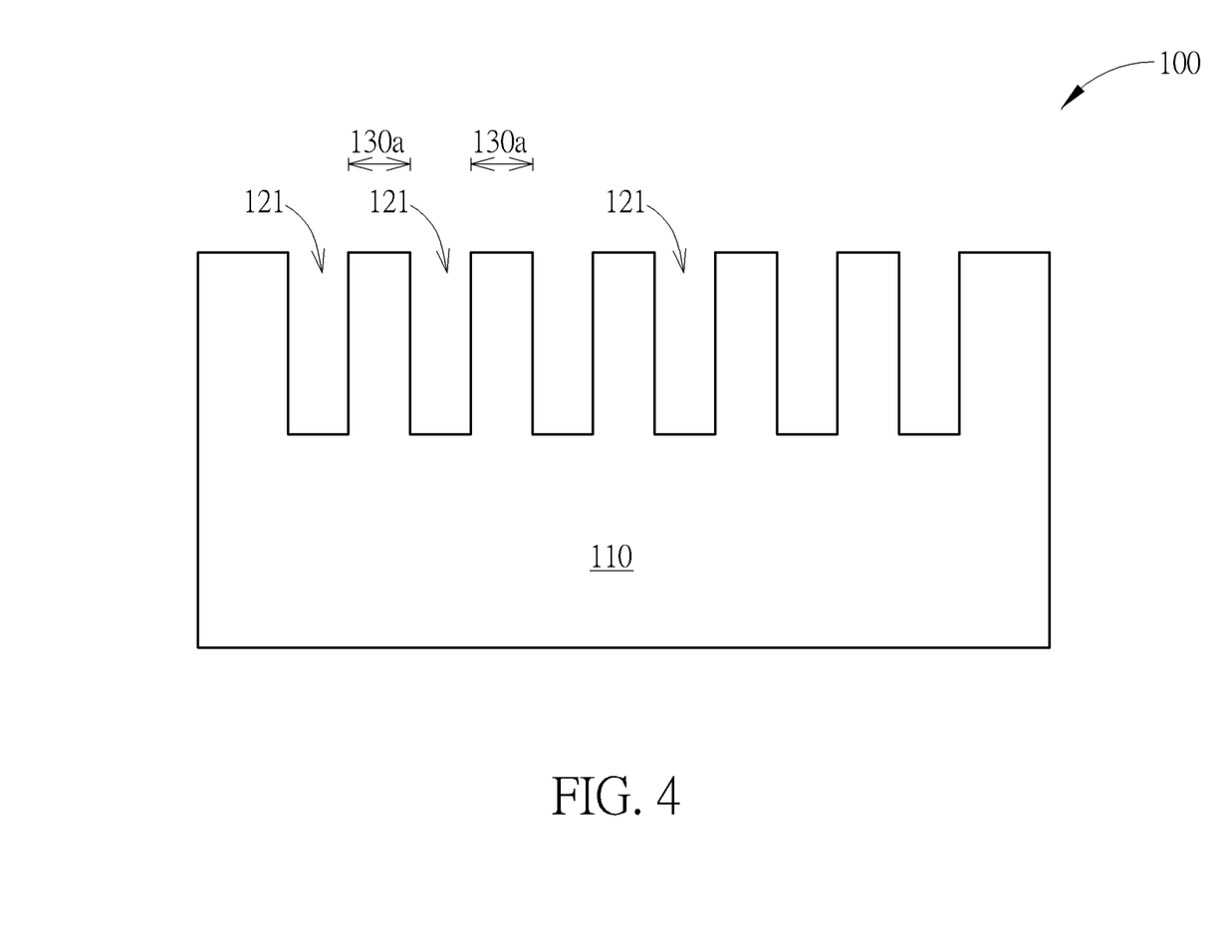
FIG. 4 shows a cross-sectional view taken along a cross-line A-A' in FIG. 3.
Figure 5:
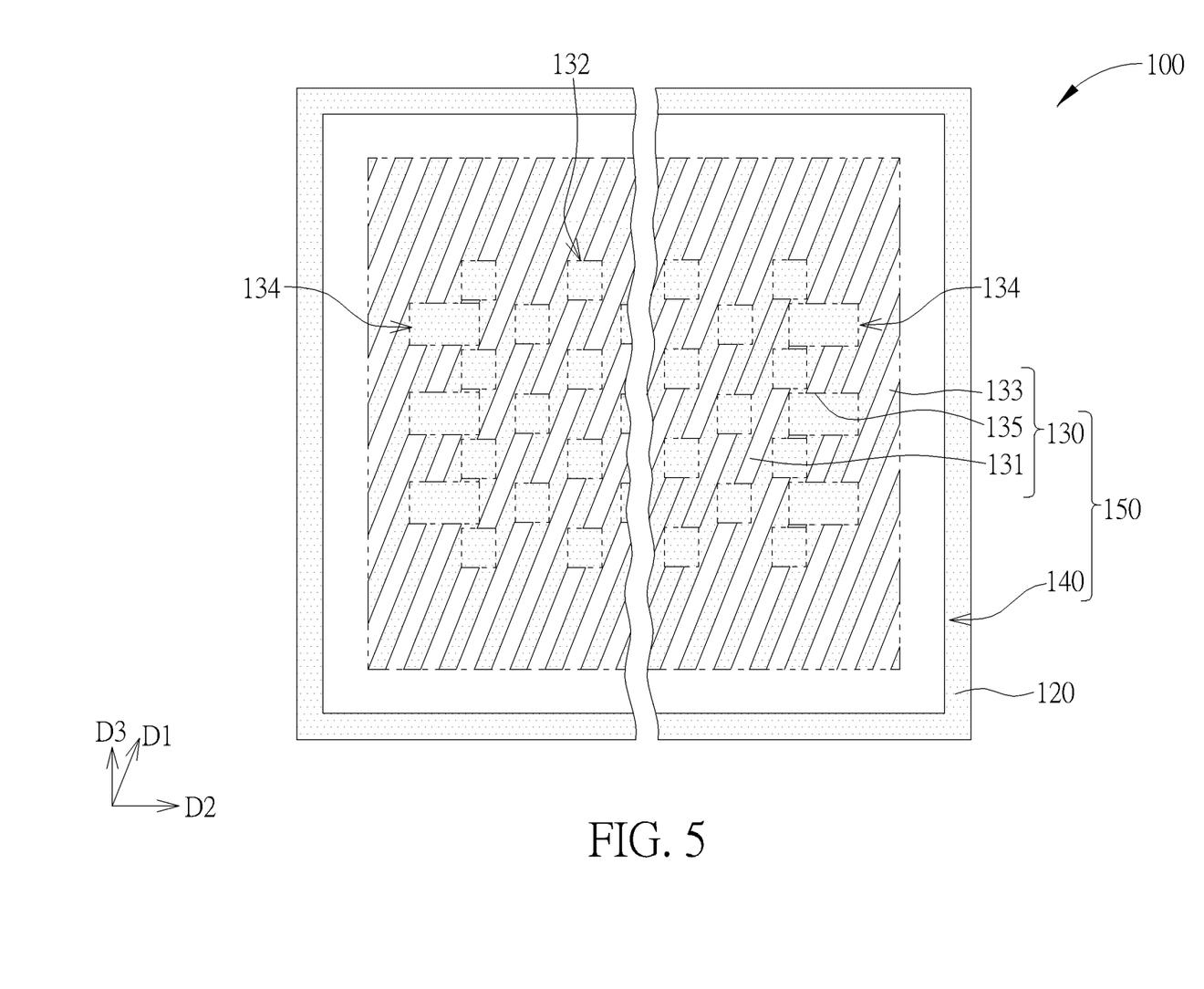
FIG. 5 shows a top view illustrating a semiconductor structure after forming first openings and second openings.

In order to enable one of ordinary skill in the art to implement the present disclosure, a method of fabricating a semiconductor device 100 of the present disclosure is further described below. Please refer to FIG. 3 to FIG. 5, which respectively illustrate a fabricating process of a semiconductor device 100 according to a preferable embodiment in the present disclosure, wherein the formation of the active structure 150 is but not limited to be accomplished by a following patterning process. Firstly, a mask layer (not shown in the drawings) may be formed on the substrate 110, with the mask layer including patterns for defining a plurality of active region units 130a and with a portion of the substrate 110 being exposed form the mask layer, and an etching process is performed by using the mask layer, to remove the portion of the substrate 110 and to form at least one shallow trench 121, and to simultaneously define the active region units 130a in the substrate 110. The active region units 130a are parallel and separately extended along the first direction D1, as shown in FIG. 3 and FIG. 4. Then, as shown in FIG. 5, another mask layer (not shown in the drawings) is formed on the substrate 110, with the another mask layer including patterns for defining the first openings 132 and the second openings 134, to expose a portion of the active region units 130a, and another etching process is performed by using the another mask layer, to remove the portion of the active region units 130a, thereby forming the first openings 132 and the second openings 134 which are marked by dotted rectangular boxes. Meanwhile, the active region units 130a are cutoff by the first openings 132 and the second openings 134, to form the first active fragments 131, the second active fragments 133, and the third active fragments 135. Following these, an insulating material (not shown in the drawings) for example including silicon oxide (SiO$_x$), silicon nitride (SiN) or silicon oxiynitride (SiON) is formed to fill in the shallow trench 121, the first openings 132, and the second openings 134, to form the shallow trench isolation 120 having a top surface being coplanar with the top surface of the substrate 110. The insulating material filled in the first openings 132 form first isolation portions 122 which is disposed either between two adjacent ones of the first active fragments 131, or between adjacent ones of the first active fragments 131 and the second active fragments 133, and the insulating material filled in the second openings 134 form second isolation portions 124 which is disposed either between two adjacent ones of the second active fragments 133, or between adjacent ones of the second active fragments 133 and the third active fragments 135, as shown in FIG. 5.

After forming the first active region 130, the second active region 140 may be next formed in the substrate 110. In the present embodiment, the formation of the second active region 140 may also be accomplished by the patterning process of the substrate 110, and which may optionally be carried out together with the patterning process of the first active region 130. That is, in the present embodiment, the same or different mask layer (s) may be used to either simultaneously define or separately define the patterns of the first active region 130 and the second active region 140, followed by etching the substrate 110, and filling in the insulating material. Then, the first active region 130 and the second active region 140 may include the same material, namely the material of the substrate 110, and also, the first edge 141 and the second edge 143 of the second active region 140, and the second active fragments 133 which are connected with the first edge 141 and the second edges 143 may be monolithic, as shown in FIG. 5. In this situation, the second active region 140 may obtain a relative stable, strengthened structure to protect the first active fragments 131 disposed at the inner side of the second active region 140. Then, the structural collapse or damage of the first active region 130 may be successfully avoided. However, people in the art should fully realize that the formation of the second active region is not limited to be accomplished through the aforementioned process, and which may also be formed through other processes, for example being carried out separately from the formation of the first active region. As an example, in one embodiment, the fabricating process of the second active region may be performed before the fabricating process of the first active region, in which, the second active region may be formed firstly through the patterning process of the substrate, and the first active region is then formed by performing an epitaxial growth process (not shown in the drawings). Accordingly, the topmost surfaces of the second active region and first active region may not be leveled with each other. Otherwise, in another embodiment, the fabricating process of the second active region may also be performed after the fabricating process of the first active region, in which, the first active region is firstly formed through he patterning process of the substrate, and the second active region is then formed through a deposition process. Accordingly, the second active region and the first active region may include different materials, for example, the second active region may include polysilicon or a dielectric material which is different from that of the substrate.

People in the art should fully realize that the semiconductor device and the fabricating method thereof are not be limited to the aforementioned embodiment and may include other examples or may be achieved through other strategies to meet practical product requirements. For example, in one embodiment, the etching conditions may be further adjusted during the patterning process of first active region 130 and/or the second active region 140, thereby forming an active structure with rounding corners (not shown in the drawings), but not limited thereto. The following description will detail the different embodiments of the semiconductor device and the fabricating method thereof in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Figure 6:
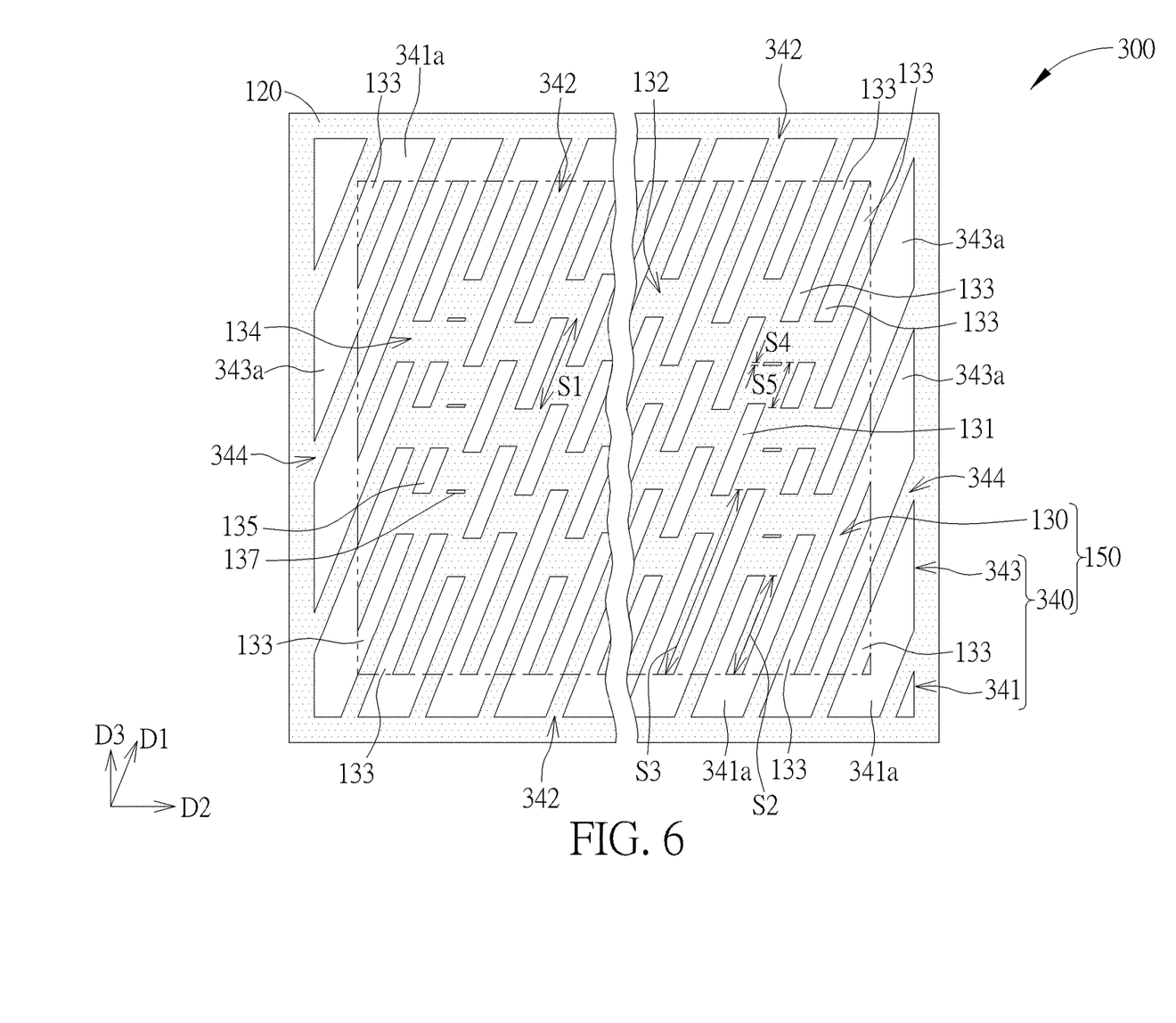
FIG. 6 is a schematic diagram illustrating a semiconductor device according to a second preferable embodiment in the present disclosure.

Please refer to FIG. 6, which illustrates a semiconductor device 300 according to the second preferable embodiment of the present disclosure. In the present embodiment, the structure of the semiconductor device 300 is substantially the same as those of the aforementioned first preferable embodiment, including the substrate 110, the active structure 150 (for example including the first active region 130 and the second active region 340), the openings 132, 134 and the shallow trench isolation 120, and which may not be redundantly described hereinafter. The difference between the semiconductor device 300 and the aforementioned semiconductor device 100 is in that a plurality of openings 342, 344 is additionally disposed within the substrate 110, to cutoff the first edge 341 and the second edge 343 of the second active region 340 into a plurality of fragments 341a, 343a.

Precisely speaking, each of the fragments 341a of the first edge 341 is separately disposed with each other to directly contact two adjacent ones of the second active fragments 133 in the second direction D2. Likewise, each of the fragments 343a of the second edge 343 is also separately disposed with each other to directly contact two adjacent ones of the second active fragments 133 in the third direction D3. Accordingly, two adjacent ones of the second active fragments 133 are connected with each other, and separated from other two adjacent ones of the second active fragments 133, as shown in FIG. 6. It is noted that, the lengths (in the first direction D1) of the two adjacent ones of the second active fragments 133 which are in connection are different from each other, for example being the lengths S2, S3, respectively, but not limited thereto.

With these arrangements, the semiconductor device 300 of the second preferable embodiment of the present disclosure is provided, in which the second active fragments 133 thereof also enable to provide different extension lengths to stabilize and to strengthen the structure of the peripheral active region, namely the second active region 340, to improve the peripheral stresses of the semiconductor device 300, and to avoid the collapse or cracking of the surrounding structure. Furthermore, the semiconductor device 300 of the present embodiment further includes openings 342, 344 disposed within the second active region 340, to further disperse the stresses on each edge (including the first edge 341 and the second edge 343) of the second active region 340, so as to obtain a more reliable structure, and also, to improve the device performance formed subsequently on the semiconductor device 300.

Figure 7:
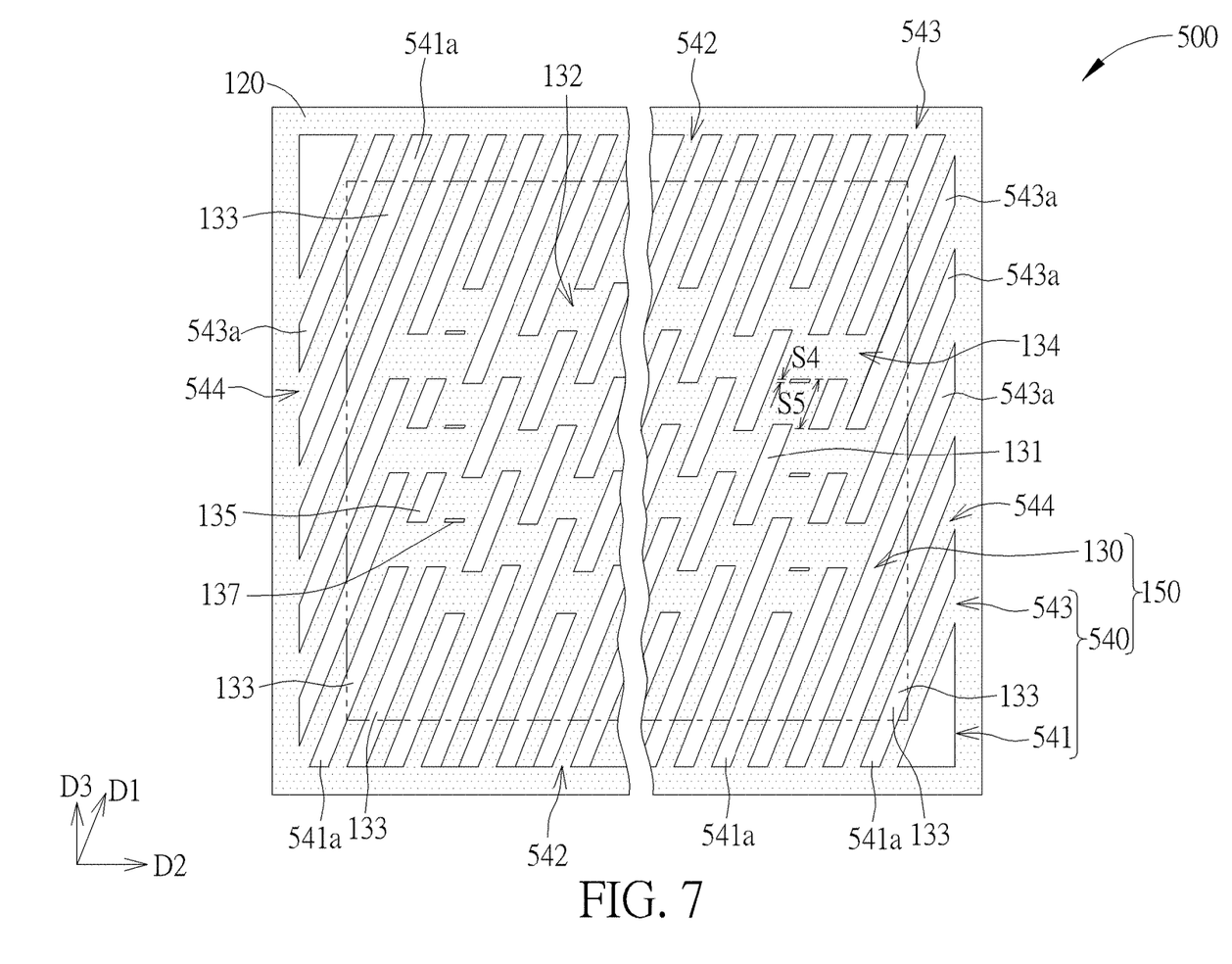
FIG. 7 is a schematic diagram illustrating a semiconductor device according to a third preferable embodiment in the present disclosure.

Please refer to FIG. 7, which illustrates a semiconductor device 500 according to the third preferable embodiment of the present disclosure. In the present embodiment, the structure of the semiconductor device 500 is substantially the same as those of the aforementioned first preferable embodiment, including the substrate 110, the active structure 150 (for example including the first active region 130 and the second active region 540), the openings 132, 134 and the shallow trench isolation 120, and which may not be redundantly described hereinafter. The difference between the semiconductor device 500 and the aforementioned semiconductor device 100 is in that a plurality of openings 542, 544 is additionally disposed within the substrate 110, to cutoff the first edge 541 and the second edge 543 of the second active region 540 into a plurality of fragments 541a, 543a.

Precisely speaking, each of the fragments 541a of the first edge 541 is separately disposed with each other in the second direction D2 to directly contact each of the second active fragments 133. Likewise, each of the fragments 543a of the second edge 543 is also separately disposed from each other in the third direction D3 to directly contact each of the second active fragments 133, as shown in FIG. 7. Accordingly, the adjacent ones of the second active fragments 133 are separated from each other, as shown in FIG. 7. With these arrangements, the semiconductor device 500 of the third preferable embodiment also enables to provide different extension lengths through the second active fragments 133, thereby stabilizing and strengthening the structure of the peripheral active region, namely the second active region 540. In this way, the peripheral stresses of the semiconductor device 500 may be improved, so as to avoid the collapse or cracking of the surrounding structure. Furthermore, the semiconductor device 500 of the present embodiment additionally includes openings 542, 544 disposes within the second active region 540, to further disperse the stresses on each edge (including the first edge 541 and the second edge 543) of the second active region 540, so as to obtain a more reliable structure, and also, to improve the device performance formed subsequently on the semiconductor device 500.

Overall speaking, according to the semiconductor device in the present disclosure, the active fragments with various greater lengths respectively are disposed outside the periphery of the active fragments disposed within the active area region, and the active fragments with various greater lengths respectively may further connect to at least one side or at least one fragment of the at least one side of the peripheral active region which is disposed within the periphery region. Through these arrangements, the active fragments with various greater lengths may enable to provide various extension lengths to stabilize and to strengthen the structure of the peripheral active region, thereby improving the stresses around the semiconductor device, and avoiding the collapse or cracking of the peripheral structure. In this way, the semiconductor device of the present disclosure may be further used on fabricating other semiconductor active devices, such as a memory device or a transistor device, so as to achieve an improved performance to the device formed subsequently.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a plurality of first active fragments, wherein the first active fragments are separately arranged in a first direction into a plurality of columns, wherein each of the columns comprises at least one of the first active fragments;
a border active structure comprising a plurality of branch active fragments extending toward one of the first active fragments;
a plurality of second active fragments, respectively between one of the first active fragments and one of the branch active fragments, wherein one of the second active fragments comprises two opposite end faces in a second direction, one of the two opposite end faces of the one of the second active fragments is aligned to an end face of the one of the branch active fragments in the second direction, and another one of the two opposite end faces of the one of the second active fragments is aligned to an end face of another one of the second active fragments in the second direction, wherein the second direction is different from the first direction; and
a shallow trench isolation, surrounding each of the first active fragments and each of the second active fragments, and directly contacting at least one side of the border active structure.

2. The semiconductor device accordingly to claim 1, wherein two adjacent ones of the branch active fragments are isolated from each other.

3. The semiconductor device accordingly to claim 1, wherein two adjacent ones of the branch active fragments are connected with each other.

4. The semiconductor device accordingly to claim 1, wherein the border active structure comprises at least one first edge extending along the second direction, and at least one second edge extending along a third direction, and the second direction is perpendicular to the third direction.

5. The semiconductor device accordingly to claim 4, wherein each of the branch active fragments directly contacts the at least one first edge, the at least one second edge, or both of the at least one first edge and the at least one second edge of the border active structure.

6. The semiconductor device accordingly to claim 4, the shallow trench isolation further comprising:
a plurality of first isolation portions, respectively disposed between two adjacent ones of the first active fragments; and
at least one second isolation portion, disposed between one of the first active fragments and the one of the branch active fragments, the at least one second isolation portion has a first width in the second direction, the first isolation portions have a second width in the second direction, and the first width is greater than the second width.

7. The semiconductor device accordingly to claim 1, wherein each of the first active fragments comprises a first length in a first direction, each of the second active fragments comprises a second length in the first direction, the second length is smaller than the first length, and each of the second active fragments is isolated from the border active structure.

8. The semiconductor device accordingly to claim 1, wherein the plurality of branch active fragments comprises at least one first branch active fragment with two ends directly in contact with the border active structure and two sides directly in contact with the shallow trench isolation, and at least one second branch active fragment with one end directly in contact with the border active structure and two sides and another end directly in contact with the shallow trench isolation.

9. A method of fabricating a semiconductor device, comprising:
forming a plurality of first active fragments, wherein the first active fragments are separately arranged in a first direction into a plurality of columns, wherein each of the columns comprises at least one of the first active fragments;
forming a border active structure comprising a plurality of branch active fragments extending toward one of the first active fragments;
forming a plurality of second active fragments, respectively between one of the first active fragments and one of the branch active fragments, wherein one of the second active fragments comprises two opposite end faces in a second direction, one of the two opposite end faces of the one of the second active fragments is aligned to an end face of the one of the branch active fragments in the second direction, and another one of the two opposite end faces of the one of the second active fragments is aligned to an end face of another one of the second active fragments in the second direction, wherein the second direction is different from the first direction; and
forming a shallow trench isolation surrounding each of the first active fragments and each of the second active fragments, and directly contacting at least one side of the border active structure.

10. The method of fabricating the semiconductor device accordingly to claim 9, wherein two adjacent ones of the branch active fragments are isolated from each other.

11. The method of fabricating the semiconductor device accordingly to claim 9, wherein two adjacent ones of the branch active fragments are connected with each other.

12. The method of fabricating the semiconductor device accordingly to claim 9, wherein each of the first active fragments comprises a first length in a first direction, each of the second active fragments comprises a second length in the first direction and the second length is smaller than the first length.

13. The method of fabricating the semiconductor device accordingly to claim 9, forming the shallow trench isolation further comprising:
forming a plurality of first isolation portions, between two adjacent ones of the first active fragments respectively; and
forming at least one second isolation portion between one of the first active fragments and the one of the branch active fragments.

14. The method of fabricating the semiconductor device accordingly to claim 13, wherein the at least one second isolation portion has a first width in the second direction, each of the first isolation portions has a second width in the second direction, and the first width is greater than the second width.

15. A semiconductor device, comprising:
a plurality of first active fragments, wherein the first active fragments are separately arranged in a first direction into a plurality of first columns, wherein each of the first columns at least comprises at least one of the first active fragments;
a border active structure comprising a plurality of branch active fragments extending toward one of the first active fragments;
a plurality of second active fragments, respectively between two of the branch active fragments, wherein a portion of the second active fragments is arranged only into a first one and a last one of the plurality of first columns;
a plurality of third active fragments, the third active fragments and a rest portion of the second active fragments are separately arranged in the first direction into a plurality of second columns, the second columns are disposed only at one side of the first one of the first columns and one side of the last one of the first columns respectively; and
a shallow trench isolation, surrounding each of the first active fragments and each of the second active fragments, and directly contacting at least one side of the border active structure;
wherein the first active fragments each comprise a first length in the first direction, and the second active fragments each comprise a length smaller than the first length in the first direction.

* * * * *